(12) United States Patent
Kim et al.

(10) Patent No.: US 9,377,526 B2
(45) Date of Patent: Jun. 28, 2016

(54) BROADBAND FREQUENCY DETECTOR

(71) Applicant: DJP CO., LTD., Seoul (KR)

(72) Inventors: Hanyong Kim, Seoul (KR); Kyungsoo Lim, Seoul (KR)

(73) Assignee: DJP CO., LTD. (KR)

( * ) Notice: Subject to any disclaimer, the term of this patent is extended or adjusted under 35 U.S.C. 154(b) by 0 days.

(21) Appl. No.: 14/758,858

(22) PCT Filed: Jan. 7, 2014

(86) PCT No.: PCT/KR2014/000144
§ 371 (c)(1),
(2) Date: Jul. 1, 2015

(87) PCT Pub. No.: WO2014/107089
PCT Pub. Date: Jul. 10, 2014

(65) Prior Publication Data
US 2015/0331088 A1    Nov. 19, 2015

(30) Foreign Application Priority Data

Jan. 7, 2013  (KR) .................. 10-2013-0001579

(51) Int. Cl.
*H03K 9/06*    (2006.01)
*G01S 7/02*    (2006.01)
(Continued)

(52) U.S. Cl.
CPC ............. *G01S 7/022* (2013.01); *G01R 29/0871* (2013.01); *H03K 5/125* (2013.01); *G08G 1/052* (2013.01)

(58) Field of Classification Search
CPC .................................. G01S 7/022; H03K 9/06
USPC ............................... 327/39, 44, 46, 47, 49, 99
See application file for complete search history.

(56) References Cited

U.S. PATENT DOCUMENTS 6,400,305 B1 *  6/2002  Kuhn .................. G01S 7/022
                                                    342/193
2009/0009390 A1   1/2009  Lee et al.
(Continued)

FOREIGN PATENT DOCUMENTS

CN       101431333       5/2009
JP       10019971        1/1998
(Continued)

OTHER PUBLICATIONS

International Search Report—PCT/KR2014/000144 dated Feb. 3, 2014.

*Primary Examiner* — William Hernandez
(74) *Attorney, Agent, or Firm* — Cantor Colburn LLP

(57) ABSTRACT

Provided is a broadband frequency detector, more particularly, to a frequency detector detecting all the signals for guiding the safe vehicle operation, and radar signals for determining vehicle speeds. The broadband frequency detector comprises: a horn antenna configured to receive signals having specific frequencies; a first amplifier configured to receive the signals having specific frequencies from the horn antenna; a mixer unit configured to receive signals from the first amplifier, wherein the signals are low noise amplified therein; and a second amplifier, arranged in parallel with the amplifier, for transferring signals to the mixer unit after low noise amplifying the signal received from the horn antenna, wherein the second amplifier includes a transistor and a first microwave circuit unit for matching the impedance of the horn antenna and the impedance of the transistor.

5 Claims, 6 Drawing Sheets

(51) Int. Cl.
*H03K 5/125* (2006.01)
*G01R 29/08* (2006.01)
*G08G 1/052* (2006.01)

(56) References Cited

U.S. PATENT DOCUMENTS

2015/0263687 A1* 9/2015 Kim .................. H03G 3/20
 381/107

2015/0301163 A1* 10/2015 Kim .................. G01S 7/022
 342/175

FOREIGN PATENT DOCUMENTS

| | | |
|---|---|---|
| JP | 11266407 | 9/1999 |
| KR | 1020010011246 | 2/2001 |
| KR | 1020070003391 | 1/2007 |
| KR | 1020080007635 | 1/2008 |
| TW | 1365599 | 6/2012 |

* cited by examiner

BROADBAND FREQUENCY DETECTOR

TECHNICAL FIELD

This invention relates to a broadband frequency detector, more particularly, to a frequency detector detecting all the signals for guiding the safe vehicle operation, and radar signals for determining vehicle speeds.

BACKGROUND ART

In advanced counties, a great deal of effort has been concentrated on safe vehicle operation using various kinds of speed meters operating with different microwave frequencies and lasers, and using transmitters for the purpose of prior safety alarm that inform various hazardous road situations. Especially in the United States of America, such speed meters and detectors are legally approved.

Types of signals used in such meters and detectors depend on the equipments in use and they are as follows.

In other words, speed guns preventing vehicle over-speeding utilize X-band (10.525 GHz), Ku-band (13.450 GHz), K-band (24.150 GHz), superwide Ka-band (diversely distributed between 33.000 GHz and 36.000 GHz), and the lasers (having wavelengths between 800 nm and 1100 nm); safety alert systems providing road information for safe vehicle operation utilize frequencies between 24.070 GHz and 24.230 GHz and transmit three information that are "railroad crossing," "under construction," and "emergency vehicle"; and safety warning systems utilize frequencies between 24.075 GHz and 24.125 GHz and transmit 64 kinds of coded information including "foggy area," "under construction," "school zone," "reduced speed," and the like.

Above mentioned safety related transceiver systems are currently revitalized in and around the United States of America, and are expanding globally, and expected to be highly interrelated with the future intelligent transportation system (ITS).

All the above mentioned frequencies and usage thereof are regulated by the Federal Communication Commission (FCC) of the United States of America.

FIG. 1 illustrates conventional broadband radar detector. As shown in FIG. 1, the broadband radar detector is comprised of: a horn antenna 10; a signal processing unit 20 detecting signal received by the horn antenna 10; a laser module 30 receiving laser signal; a central processing unit 40 controlling signal detection from the signal processing unit 20 and the laser module 30; a visualizing means 50 visually displaying the detected signals; and a voice means 60 presenting the detected signals as a voice via voice amplification unit 61; and, receives signals at 9 frequency bands including X, VG2, Ku, K, SA, SWS, superwide Ka, and laser, and outputs received signals in a best-fit manner corresponding to the user's situation thereby assisting the user on safety vehicle operation.

Besides, since conventional MMIC based wideband radar detectors receive frequencies between 24 GHz and 36 GHz therefore Ka band frequencies can be detected, however, the X-band, VG2-band and Ku-band frequencies cannot be detected. Thus, there is a need for a wideband frequency detector that can detect wideband frequencies while using MMICs therein.

SUMMARY OF INVENTION

Technical Problem

An objective of the invention is to provide a broadband detector that can detect multiple frequency bands.

Another objective of the invention is to provide a detection method not only for X-band frequencies but also for K-band or Ka-band frequencies by using a single frequency detector.

Yet another objective of the invention is to provide a frequency detector capable of quickly shifting from X-band frequencies to K-band or Ka-band frequencies and detecting frequency of interest therein.

Yet another objective of the invention is to provide a frequency detector capable of quickly shifting from K-band or Ka-band frequencies to X-band frequencies and detecting frequency of interest therein.

Solution to Problem

For this purpose, a broadband frequency detector of the present invention broadband frequency detector includes: a first amplifier configured to receive signals having specific frequencies from a horn antenna; a mixer unit configured to receive the signals subjected to low-noise amplification from the first amplifier; and a second amplifier arranged in parallel with the first amplifier and configured to transfer the signals received from the horn antenna to the mixer unit by performing low-noise amplification thereof, wherein the second amplifier includes a transistor and a first microwave circuit unit for matching an impedance of the horn antenna and that of the first microwave circuit unit.

Advantageous Effects of Invention

The broadband frequency detector of the invention can detect X-band frequencies and K-band or Ka-band frequencies as well using a single frequency detector. In addition, the broadband frequency detector of the invention has an advantage that any operating frequency can quickly be shifted from a specific frequency range to a different frequency range and detect the frequency of interest therein using a multiple local oscillator units and switches.

DETAILED DESCRIPTION OF EMBODIMENT

As described above, the additional features of the present invention will be more apparent through the preferred exemplary embodiments with reference to the accompanying drawings. Hereinafter the present invention will be described in detail for the person of ordinary skill in the art shall readily understand and reproduce through such exemplary embodiments.

Figure 1:
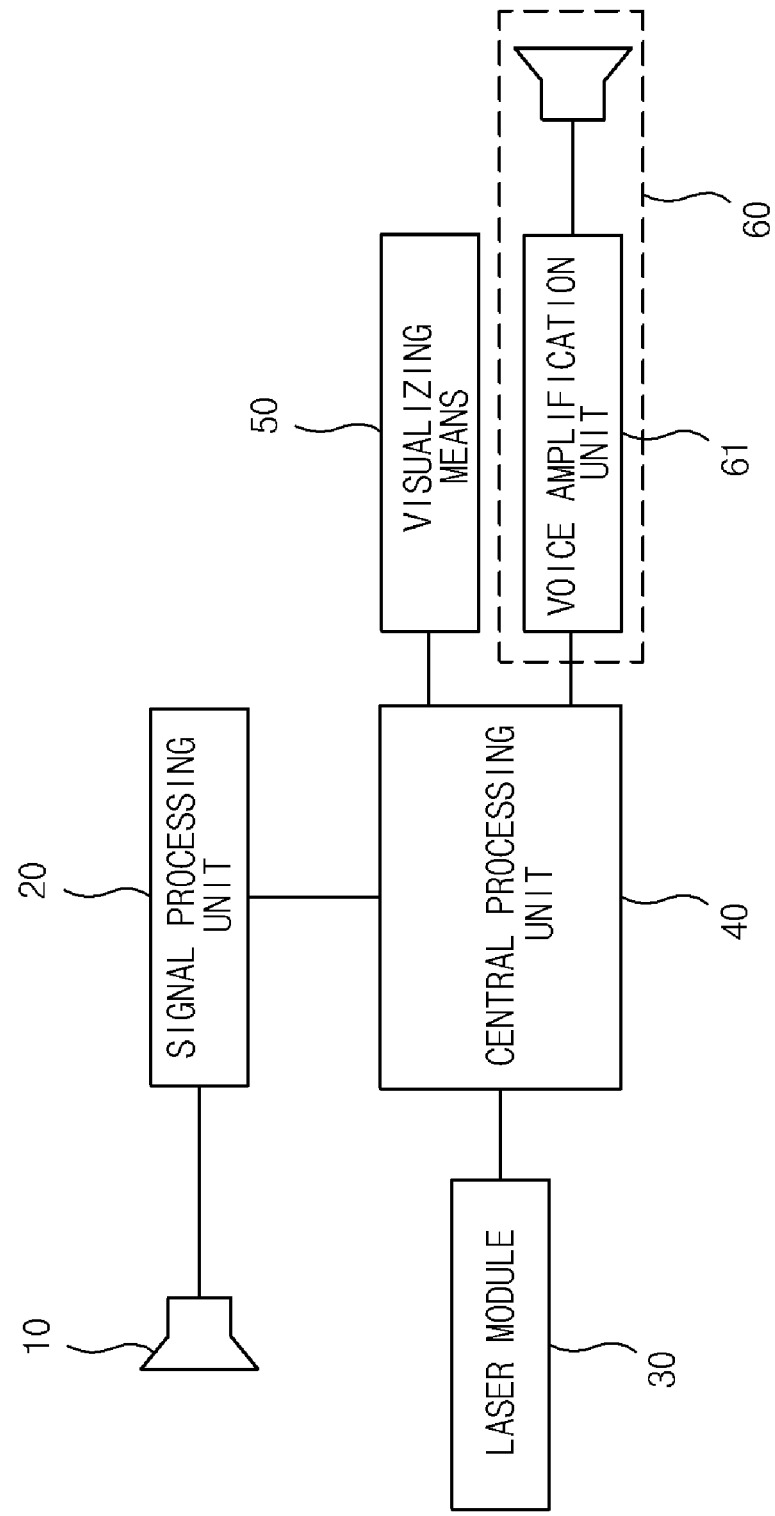
FIG. 1 illustrates conventional broadband radar detector.
Figure 2:
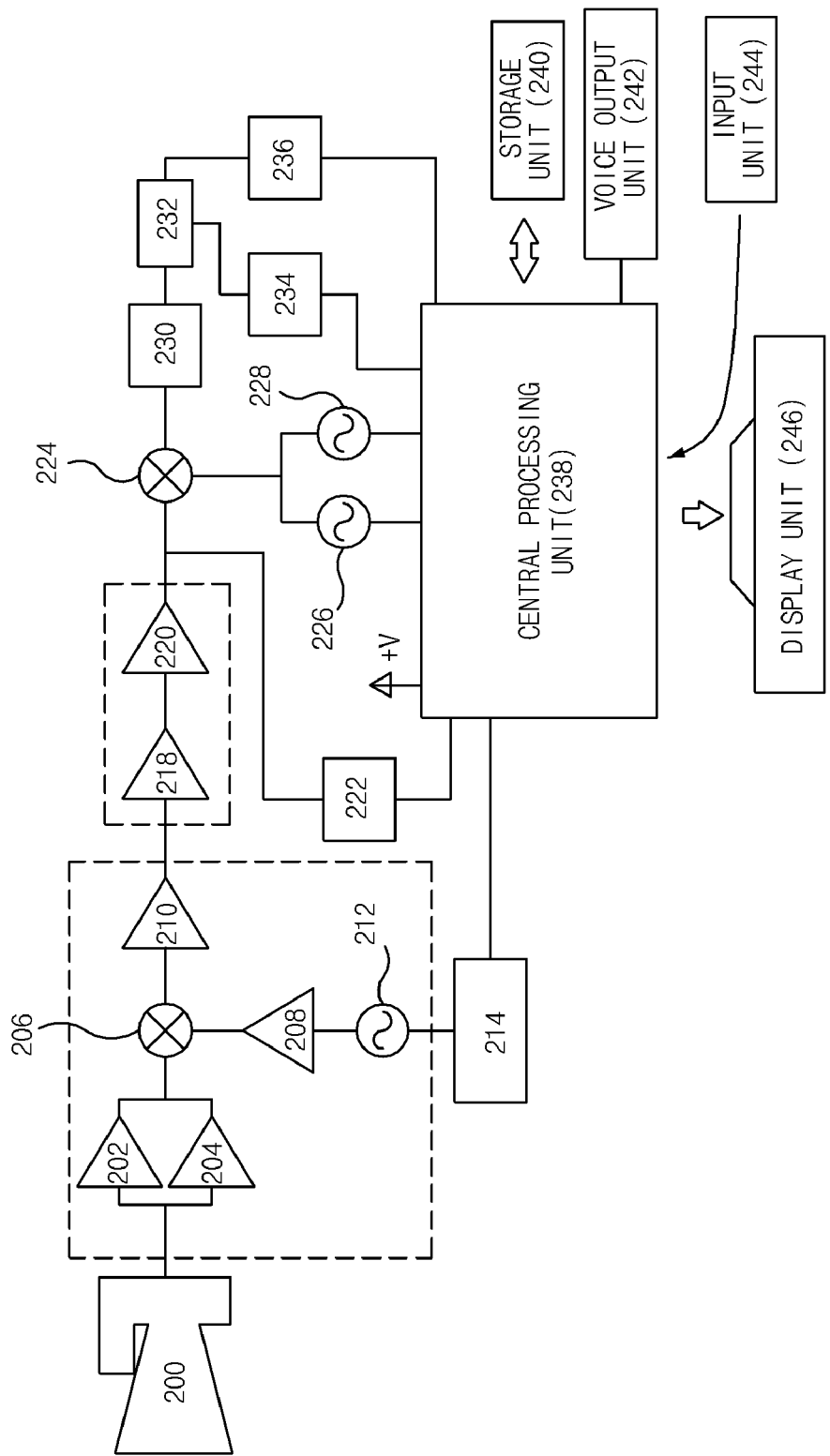
FIG. 2 is a block diagram illustrating configuration of a broadband frequency detector according to an exemplary embodiment of the invention.

FIG. 2 is a block diagram illustrating configuration of a broadband frequency detector according to an exemplary embodiment of the invention. Hereinafter the configuration of a broadband frequency detector in accordance with an exemplary embodiment of the invention will be investigated in detail using FIG. 2.

A horn antenna 200 receives signals having specific frequencies from outside. As described in detail, the horn antenna 200 of the invention receives frequencies having broadband. Generally, the receiving frequency range of the horn antenna 200 is between 10 GHz and 36 GHz.

The signals received by the horn antenna 200 are transferred to the monolithic microwave integrated circuit (referred to as MMIC hereinafter) low noise amplifier (referred to as LNA hereinafter) 202, which is the first amplifier, and then to the pseudomorphic high electron mobility transistor (referred to as pHEMT hereinafter) low noise amplifier, which is the second amplifier. The MMIC LNA 202 is used for receiving frequencies having K-band and X-band frequency ranges, while the pHEMT LNA 204 is used for detection of X-band frequency range. In other words, the MMIC LNA 202 outputs signals having Ka-band frequency range after amplification thereof, while the pHEMT LNA 204 outputs signals having K-band and X-band frequency ranges after amplification therein. Specifically, the pHEMT LNA 204 is used to detect signals having frequencies from 10 GHz to 260 GHz, while the MMIC LNA 202 is used to detect signals having frequencies above 26 GHz.

In addition, the MMIC LNA 202 and the pHEMT LNA 204 receive signals form the horn antenna 200, and at the same time, receive a control signal from the switch control unit 216. The operation of the MMIC LNA 202 and the pHEMT LNA 204 is controlled by using the control signal. In other words, the switch control unit 216 controls whether the MMIC LNA 202 and the pHEMT LNA 204 should be driven or not by using the control signal.

The output signals from the MMIC LNA 202 and the pHEMT LNA 204 are transferred to the first mixer unit 206. The first mixer unit 206 outputs a signal having the first intermediate frequency range which is a mixture of the signal received from the MMIC LNA 202 and the pHEMT LNA 204 and the signal received from the first LNA 208. In other words, the first mixer unit 206 mixes the frequency of the signal received from the MMIC LNA 202 and the signal received from the pHEMT LNA 204 with the signal from the first LNA 208 so that the received signals have the frequency of 1 GHz.

The first LNA 208 amplifies signals within specific frequency range that are generated from the first local oscillator unit 212, and transfers the amplified signals to the first mixer unit 206.

The first local oscillator unit 212 controls (readjusts) voltages to vary the frequencies by the DAC sweep voltage waveforms that are generated from the sweep control unit 214. The first local oscillator unit 212 generates frequencies according to the readjusted voltages, and when an appropriate signal is received as in the white noise, it enables generation of reliable white noise pulse via sweep voltage control, and eliminates medium/high frequency noise.

Output signal from the first mixer unit 206 is transferred to the second LNA 210. The second LNA 210 amplifies the received signal with low noise and transfers the signal to the third LNA 218. The third LNA 218 amplifies the received signal with low noise and transfers the signal to the fourth LNA 220. The fourth LNA 220 amplifies the received signal with low noise and transfers the signal to the second mixer unit 224. FIG. 2 illustrates the second LNA to the fourth LNA, but not limited to them. In other words, number of LNAs may vary depending on characteristics of the broadband frequency detectors.

The second mixer unit 224 converts the first intermediate frequency into the second intermediate frequency according to the band of the received signal among the oscillated frequencies from the second local oscillator unit 226 or the third local oscillator unit 228 that are designed to receive all the transferred signals having frequencies within a broadband range.

The second oscillator unit 226 outputs signals having frequencies from 550 MHz to 650 MHz by the pulse output from the central processing unit, and the third oscillator unit 228 outputs signals having frequencies from 1500 MHz to 2000 MHz.

According to the prior art, oscillation frequencies are fixed when a signal is received. Therefore, when another signal is received, it cannot be detected until the previously received signal disappears, or frequencies must be scanned for a specific time period for the signal detection. However, as described earlier, the present invention allows quick reception of signals in a different frequency band by controlling oscillation frequencies from the first local oscillator unit to the third local oscillator unit while receiving a signal in a specific frequency band. Therefore, the present invention can eliminate practically useless signal range by quickly setting the priorities of the received signals in the central processing unit.

Output signal from the second mixer unit 224 is transferred to the second filter 230. Among the received signals only 10 MHz signal is passed through the second filter 230 and transferred to the demodulation unit 232. The received signal is detected by the demodulation unit 232 and transferred to the third filter 234 or the fourth filter 236. The third filter 234 passes signals of low frequency range to measure RSSI from the received signals, and the fourth filter 236 passes signals of a specific frequency range and transfers the signals to the central processing unit 238.

Besides, the broadband frequency detector of the invention includes a display unit 246 for displaying the operating conditions of the detector or other necessary information, an input unit 244 for inputting necessary information, and a voice output unit 242 for outputting the operating conditions of the detector or other necessary information. In addition, the broadband frequency detector includes a storage unit 240 for storing information required for driving the broadband frequency detector or other necessary information.

Figure 3:
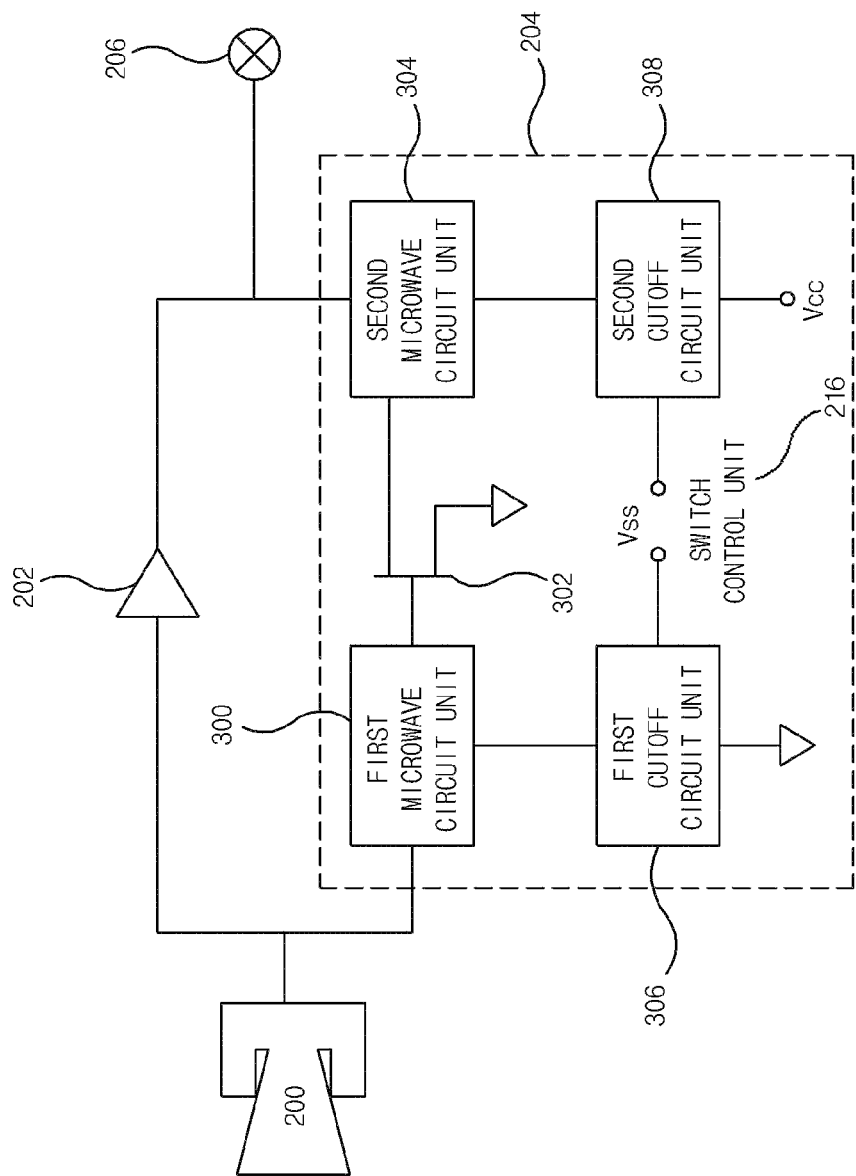
FIG. 3 is a block diagram illustrating configuration of a pHEMT LNA according to an exemplary embodiment of the invention.

FIG. 3 is a block diagram illustrating configuration of a pHEMT LNA according to an exemplary embodiment of the invention. Hereinafter the configuration of a pHEMT LNA in accordance with an exemplary embodiment of the invention will be investigated in detail using FIG. 3.

According to FIG. 3, the configuration of the LNA includes a micro circuit unit (M/C), transistor (TR), and a frequency cutoff unit. Of course other configuration may be further included in the configuration.

The first microwave circuit unit 300 receives signals received by the horn antenna 200.

The first frequency cutoff unit 306 is connected to the first microwave circuit unit 300, and enables the output signal from the first microwave circuit unit 300 to be transferred to the transistor 302 by blocking the predetermined frequency range.

Output signal from the first microwave circuit unit 300 is inputted to the gate of the transistor 302. The source of the transistor 302 is grounded and the drain is connected to the second microwave circuit unit 304. One end of the second microwave circuit unit 304 is connected to the frequency cutoff unit 308 and the other end is connected to the mixer unit 206. Hereinafter operations performed in the pHEMT LNA will be described in detail.

The first microwave circuit unit 300 matches the impedance of the input signal with the impedance of the transistor 302. Or the first microwave circuit unit 300 may match the voltage of the input signal to the voltage of the transistor 302.

The first frequency cutoff unit 306 cuts off signals having specific frequencies among the input signals to the first microwave circuit unit 300. In other words, the first frequency cutoff unit 306 enables signals having specific frequencies to be transferred to the transistor 302, and prevents signals having frequencies other than the specific frequencies from being transferred to the transistor 302. As described above, the first frequency cutoff unit 306 transfers the signals having frequencies between 10 GHz to 26 GHz to the transistor 302, and prevents signals having frequencies between 10 GHz to 26 GHz from being transferred to the ground.

The second microwave circuit unit 304 matches the impedance of the output signal of the transistor 302 with the impedance of the mixer unit 206.

The second frequency cutoff unit 308 cuts off signals having specific frequencies among the input signals to the second microwave circuit unit 304. In other words, the second frequency cutoff unit 308 enables signals having specific frequencies to be transferred to the mixer unit 206, and prevents signals having frequencies other than the specific frequencies from being transferred to the mixer unit 206. As described above, the second frequency cutoff unit 306 transfers the signals having frequencies between 10 GHz to 26 GHz to the mixer unit 206, and prevents signals having frequencies between 10 GHz to 26 GHz from being transferred to the power supply (Vcc).

In accordance with the present invention, the first frequency cutoff unit 306 and the second frequency cutoff unit 308 are connected to the switch control unit. In other words, the first frequency cutoff unit 306 and the second frequency cutoff unit 308 cutoff the signals within the predetermined frequency range according to the control command of the switch control unit.

Figure 4:
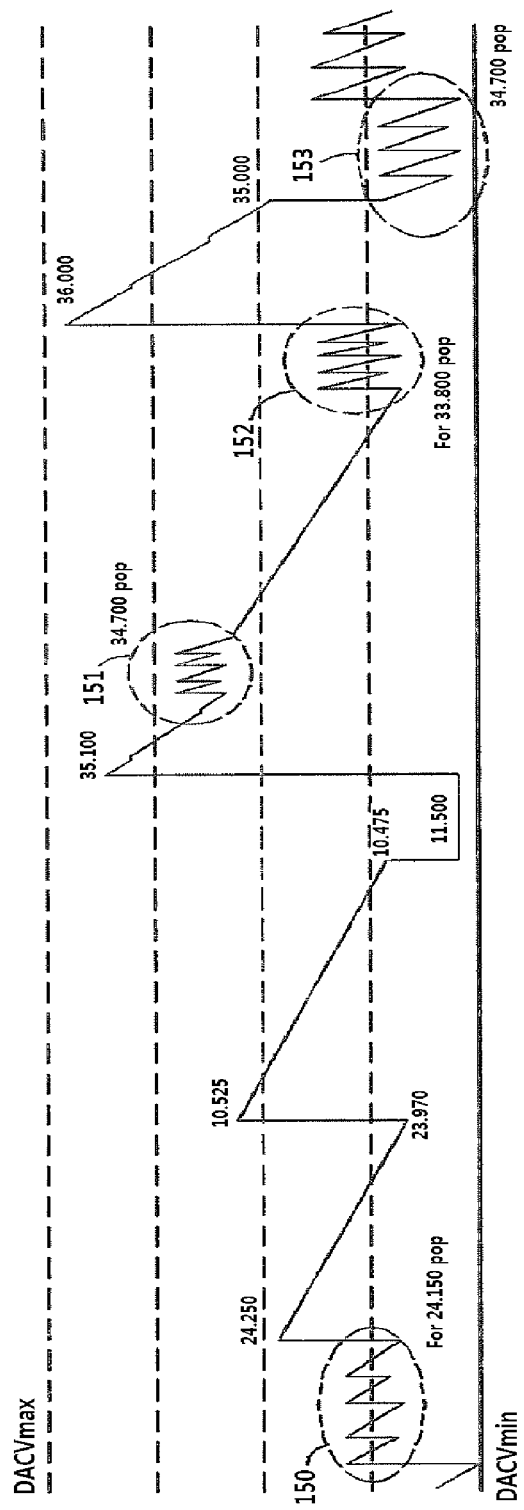
FIG. 4 illustrates a voltage waveform for controlling the output signal from the first local oscillator unit according to an exemplary embodiment of the invention.

FIG. 4 illustrates a voltage waveform to control the output signal from the first local oscillator unit according to an exemplary embodiment of the invention. Maximum and minimum values of the voltage are stored in the memory after adequately setting the values beforehand corresponding to the frequencies via tuning process. The present invention is designed to detect Doppler signals generated from the "instantaneous pulse method" by performing periodically continuous short sweeps (150, 151, 152) in order to increase detection probability. In the present invention, the slope of the output voltage (DAC voltage) from the central processing unit is adjusted in order to adjust receiving sensitivities for each frequency to be detected, and basically, the receiving sensitivities decrease as the slopes get steeper while the receiving sensitivities increase as the slopes get lowered. That is to say, DAC voltage is applied to the first oscillator unit and mixed with the input frequency in the first mixer unit, wherein operation time of this process is associated with the sensitivity, and this is controlled by the slope of the sweep.

Using this principle, for the frequency range (frequency range excluding 33.8 GHz, 34.7 GHz, and 24.150 GHz) where the sensitivity should be maximized while the operational reaction speed is adjusted to normal, the slope of the sweep is lowered.

Meanwhile, for the frequencies where the sensitivity may decrease more or less but short signal may possibly be applied, the slope of the sweep is rather set to steep and the frequency range which suffice the frequencies is continuously and repeatedly swept many times thereby increasing the frequency reception rate.

Figure 5:
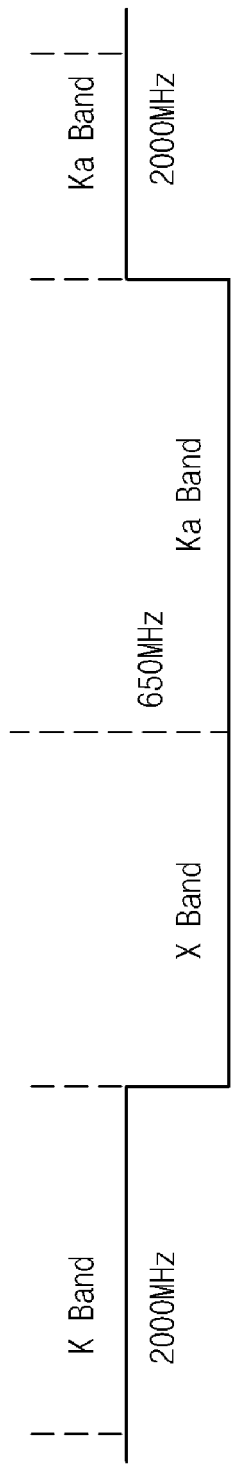
FIG. 5 is a waveform of a signal for controlling the second local oscillator unit and the third local oscillator unit.

FIG. 5 shows a waveform of a signal for controlling the second local oscillator unit and the third local oscillator unit. According to FIG. 5, the signal for controlling the second local oscillator unit or the third local oscillator unit controls the frequency which is mixed with the first intermediate frequency, and for selecting each corresponding local oscillation frequency it is stored in the built-in flash memory which is a program memory inside the central processing unit.

Figure 6:
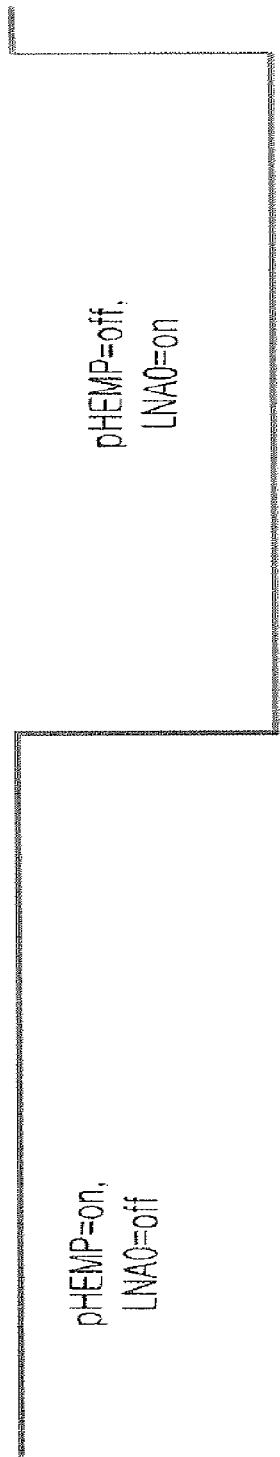
FIG. 6 is a control waveform for a X/K-band LNA and a Ka-band LNA according to an exemplary embodiment of the invention.

FIG. 6 shows a control waveform for an K/X-band LNA (pHEMT LNA) and a Ka-band LNA (MMIC LNA). According to FIG. 5, since only K/X-band LNA is operated for a sweep interval for surveying K/X-band detection, the possibility of misoperation caused by failing to recognize a Ka-Band signal entered into the K/X-band surveying interval is primarily eliminated. And, during the interval for surveying Ka-band, K/X-band LNA is cutoff and Ka-band LNA is operated.

Although the present invention is described with reference to one embodiment as illustrated in the drawings, it is merely exemplary and it will be understood for the person of ordinary skill in the art that various variations and equivalent other exemplary embodiments are possible from the foregoing disclosure.

The invention claimed is:

1. A broadband frequency detector comprising:
    a first amplifier configured to receive signals having specific frequencies from a horn antenna;
    a mixer unit configured to receive the signals subjected to low-noise amplification from the first amplifier; and
    a second amplifier arranged in parallel with the first amplifier and configured to transfer the signals received from the horn antenna to the mixer unit by performing low-noise amplification thereof,
    wherein the second amplifier includes a transistor and a first microwave circuit unit for matching an impedance of the horn antenna and that of the first microwave circuit unit.

2. The broadband frequency detector according to claim 1, further comprising a switch control unit configured to control the first amplifier and the second amplifier such that the signal received from the horn antenna is received by either the first amplifier or the second amplifier.

3. The broadband frequency detector according to claim 2, wherein the first amplifier is a monolithic microwave integrated circuit low noise amplifier (MMIC LNA), and the second amplifier is a pseudomorphic high electron mobility transistor low noise amplifier (pHEMT LNA).

4. The broadband frequency detector according to claim 3, wherein the first amplifier is configured to perform low-noise amplification of Ka-band frequency signals, and the second amplifier is configured to perform low-noise amplification of K-band or X-band frequency signals.

5. The broadband frequency detector according to claim 4, wherein the second amplifier includes:
    a first microwave circuit unit configured to match an impedance of the horn antenna and that of the transistor;
    a second microwave circuit unit configured to match an impedance of the transistor and that of the mixer unit;
    a first frequency cutoff unit connected with the first microwave circuit unit and configured to cut off signals having a predetermined frequency range; and a second frequency cutoff unit connected with the second microwave circuit unit and configured to cut off signals having the predetermined frequency range, wherein the first microwave circuit unit is configured to transfer signals having the predetermined frequency range to the transistor, and the second microwave circuit unit transfers signals having the predetermined frequency range to the mixer unit.

\* \* \* \* \*